(12) United States Patent
Meliga et al.

(10) Patent No.: US 6,226,311 B1
(45) Date of Patent: May 1, 2001

(54) LASER MODULE WITH EXTERNAL CAVITY AND OPTICAL FIBRE REFLECTOR

(75) Inventors: Marina Meliga, Sudario; Roberto Paoletti, Via Bosio; Marco Scofet, Via Mastri; Luigi Tallone, Via Villaggio Belvedere, all of (IT)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/265,007

(22) Filed: Mar. 9, 1999

(30) Foreign Application Priority Data

Apr. 10, 1998 (IT) ............................................... TO98A0306

(51) Int. Cl.⁷ ........................................................ H01S 3/08
(52) U.S. Cl. .............................. 372/102; 372/102; 372/6; 372/96; 372/92; 372/97; 372/49
(58) Field of Search .................................. 372/102, 6, 92, 372/96, 49, 95, 97

(56) References Cited

U.S. PATENT DOCUMENTS

| 5,845,030 | * | 12/1998 | Sasaki et al. | 385/88 |
| 5,870,417 | * | 2/1999 | Verdiell et al. | 372/32 |
| 5,905,745 | * | 5/1999 | Grubb et al. | 372/6 |

\* cited by examiner

*Primary Examiner*—Robert H. Kim
*Assistant Examiner*—Delma R Flores Ruiz
(74) *Attorney, Agent, or Firm*—Herbert Dubno

(57) ABSTRACT

A laser module (1) comprises a Fabry-Perot cavity active element (2) with a facet (3) bearing an anti-reflection coating and an external cavity made by an optical fibre Bragg grating (5) with low reflectivity. This grating (5) presents a non-uniform profile of modulation of the refractive index, asymmetrical in the direction of the grating length, such as to give rise to a position of the equivalent mirror plane that is offset towards the end of the grating (5) that is closer to the active element (2).

4 Claims, 1 Drawing Sheet

LASER MODULE WITH EXTERNAL CAVITY AND OPTICAL FIBRE REFLECTOR

FIELD OF THE INVENTION

The present invention relates to sources for optical telecommunication systems and, more specifically, to a laser with an external cavity made by an optical fiber Bragg grating. Such devices are known in the art as HDBR (Hybrid Distributed Bragg Reflector) lasers or Fiber Grating (FG) lasers.

Such devices generally comprise a Fabry-Perot semiconductor active element (laser diode) with a terminal facet bearing an anti-reflection coating, coupled to a grating written on a length of optical fiber tapered at one end and positioned with the tapered end adjacent to the facet bearing the anti-reflection coating. As described in the literature, lasers of this kind are particularly well suited for use as sources of pump radiation, single mode sources for optical telecommunication systems, in particular wavelength division multiplexing systems, mode locked lasers for the generation of pulses within a wide frequency range, etc.

BACKGROUND OF THE INVENTION

For a review of the applications of such lasers, reference can be made for instance to the papers "Lightwave Applications for Fiber Bragg Gratings", C. R. Giles, Journal of Lightwave Technology, Vol. 15, No. 8, August 1997, pages 1391 et seq., and "Fiber Gratings in Lasers and Amplifiers", by J. Archambault and S. G. Grubb, ibid. pages 1379 et seq.

It is well known that some of the characteristics of the aforesaid lasers are linked to the overall length of the cavity, which in a hybrid laser is given by the sum of the length of the cavity of the active element, of the distance between the anti-reflection coated facet and the tip of the tapered fiber end and lastly of the length of the fiber portion between the tip and the equivalent mirror plane of the grating. The equivalent mirror plane, as is well known, is the plane wherein a mirror would have to be positioned in order that a pulse sent by a source and reflected by the mirror returns to the source in the same time the pulse sent into the grating would take to return. In particular, the shorter the cavity of the laser, the greater the modulation band obtainable and the better the mode separation. It is evident that the attainment of good characteristics in terms of modulation band and mode separation is of particular interest for the use of lasers as sources for telecommunication systems.

The conventional low-reflecting Bragg gratings (with output reflectivity of the order of 70% currently used to form the external cavity of hybrid lasers have a profile of modulation of the refractive index that is symmetrical with respect to the central point in the grating, thus giving rise to an equivalent mirror plane positioned substantially at the center of the grating. On the other hand highly reflective gratings—with substantially 100% reflectivity—cannot be used, for the external cavity of the laser even if they would in themselves have an equivalent mirror plane offset towards one end because they would not allow sufficient power in the fiber.

The gratings used for these applications have a length of the order of a centimeter and thus the length of the external cavity constitutes nearly the entirety of the length of the whole cavity, since the active element has a cavity length of the order of 200 µm. The use of conventional gratings may then give rise to a cavity length that is not sufficiently limited to obtain satisfactory characteristics for the laser. One could think of reducing the drawback by writing the grating in the end portion of the fiber, but this gives rise to additional problems when the fiber is fastened by means of resins onto the support of the module. It is evident that one of the fastening points must be in correspondence with the end portion, to guarantee the constant alignment between the active element and the fiber, and under such conditions the resin interacts with the grating. Experience has shown that the resin, upon curing, causes alternations in the structure of the grating, thus rendering the solution unfeasible.

SUMMARY OF THE INVENTION

These problems are solved by the laser according to the invention, where the external cavity makes use of a fiber grating with such a profile of modulation of the refractive index as to give a reduced equivalent grating length while maintaining a low reflectivity. In this way the overall length of the cavity is sufficiently limited.

A laser module is provided comprising a Fabry-Perot cavity active element with a facet treated with an anti-reflection coating and an external cavity made by a low reflectivity optical fiber grating. This grating presents a profile of modulation of the refractive index that is non-uniform and asymmetrical in the direction of the length, and is such as to give rise to a position of the equivalent mirror plane that is offset towards one end of the grating, and the grating is mounted in such a way that this latter end is the grating end closest to the laser. In a preferred embodiment, this profile of modulation is represented by a curve which has minimum and substantially null value, with substantially horizontal tangent, in correspondence with the grating end that is farther away from the laser, and then rises gradually and monotonically to a maximum value, also with substantially horizontal tangent, which is reached in correspondence with the other end of the grating, where the curve returns to the minimum value with a substantially vertical slope.

By wave of a nonlimiting example, the profile of modulation of the refractive index, in the portion with gradual variation, can have a trend represented by one of the following functions: $y=\exp(-x^2)$, $y=\sin^2 x$, $y=\tanh x$.

BRIEF DESCRIPTION OF THE DRAWING

For further clarification, reference is made to the accompanying drawing wherein.

SPECIFIC DESCRIPTION

Figure 1:
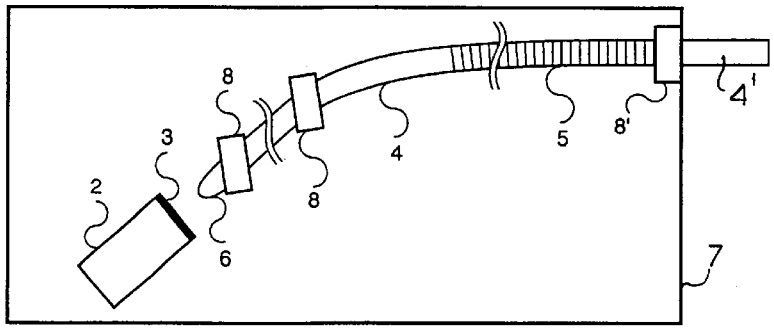
FIG. 1 is a schematic view of a hybrid laser.

As FIG. 1 shows, a hybrid laser, indicated in its entirety with reference numeral 1, comprises a Fabry-Perot cavity active element 2, made of semiconductor material and having a terminal facet 3 bearing an anti-reflection coating, and a length of optical fiber 4 on which a grating 5 is written. By way of example, the active element 2 can be an InGaAsP:InP, SI-BH (Semi-Insulating Buried Heterostructure) laser, with a modulation band of the order of 10 GHz or more.

Fiber 4 terminates in a tapered end 6 positioned adjacent to facet 3 of active element 2. In a wholly conventional manner, the active element 2 and the fiber 4 are fastened onto a common support 7 (e.g. belonging to the package of the module) by means of a resin (specifically, an acrylic resin), as indicated at 8. The resin must block the entire end portion of fiber 4 comprising the tapered end 6, in order to guarantee the proper alignment of the fiber 4 with terminal facet 3 of active element 2. Yet, for the reasons explained in the introduction of the invention, the grating must be outside the fastening region.

In fastening the fiber onto support 7, it is to be taken into account that environmental conditions are mechanical stresses can cause variations of the grating pitch thereby affecting the emission wavelength of the module. Such variations can be due in particular to deformation of support 7 because of temperature changes or simply to pulling forces exerted on fiber tail 4'. To avoid such variations of the grating pitch, the fiber 4 will be fastened also in correspondence of the end of the support (the end wall of the package) as shown in 8' and the grating region will be slightly bent so as to damp any stress in the grating region itself.

As said before, the end portion of the fiber 4 adjacent to the tapered part 6 cannot be used for writing the grating. The fiber therefore contributes to the overall length of the laser cavity for the entire section spanning between the end of the tapered part and the equivalent mirror plane of the grating 4.

In order to reduce the overall length of the external cavity, the grating 4 used in the laser according to the invention is a grating with equivalent mirror plane offset towards the end closer to the active element.

Figure 2:
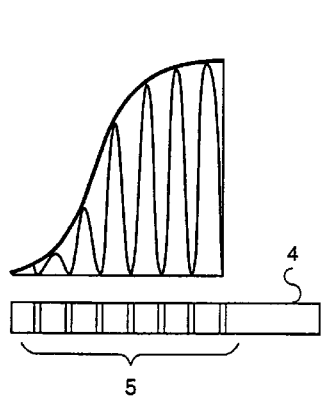
FIG. 2 shows the profile of modulation of the refractive index of the grating employed to form the external cavity.

FIG. 2 shows a possible profile of modulation of the refractive index capable of shifting the equivalent mirror plane towards one grating end. The profile is an asymmetrical, non-uniform profile, and it is represented by a curve which has a substantially null minimum value, with horizontal tangent, in correspondence with the grating end that is the farther from the taper of the fiber, gradually and monotonically rises until reaching a maximum value, also with substantially horizontal tangent, which is attained in correspondence with the end of the grating that is closer to the taper, and returns to a substantially null value with substantially vertical slope. In the Figure, for the sake of drawing clarity, the pitch of the grating 4 is artificially lengthened with respect to reality.

Profiles of modulation of the refractive index that meet the requirements of the invention are for instance those corresponding to half of a Gaussian curve, i.e. a curve of the type $y=\exp(-x^2)$, or of a curve of the type $y=\sin^2 x$ or yet again of a curve of the type $y=\tanh x$. FIG. 2 refers to the case of a half-Gaussian profile.

The method whereby a grating of this kind can be manufactured is the subject matter of a patent application with title "Fibre Bragg grating with offset equivalent mirror plane and method for its manufacture" in the name of the same assignee filed concurrently herewith (Ser. No. 09/265,004).

A profile of this type actually moves the equivalent mirror plane towards one end of the grating, as is readily apparent when applying the description provided in L. A. Coldren, S. W. Corzine: "Diode lasers and photonic integrated circuits", Wiley & Sons, 1995, pp. 85 et seq., and as it is confirmed by the measurements carried out.

Considering by way of example a half-Gaussian profile like the one shown in FIG. 2, a grating about 1 cm long with reflectivity of the order of 70% (which are typical values of these applications) has an equivalent length of about 2 mm. By way of comparison, a conventional grating with equal length and similar reflectivity would have an equivalent length of about 5 mm. Taking into account that the fiber end portion to leave available for fastening can be of the order of 3 mm, the invention allows shortening of the laser cavity by an amount practically corresponding to the fiber portion that is unusable because of the problems inherent to resin fastening.

The person skilled in the art is able to evaluate, by applying well known relationships, the advantage that such a reduction in the length of the cavity provides in terms of bandwidth and mode separation.

Figure 3:
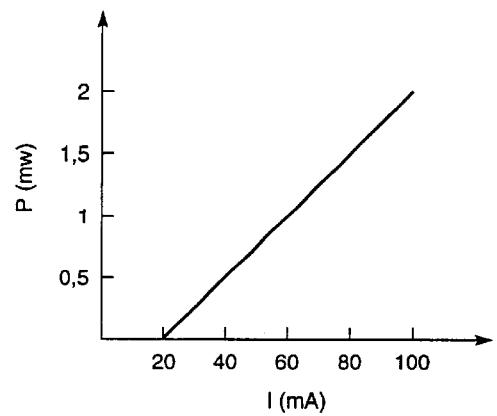
FIGS. 3–5 are graphs allowing evaluation of the performance of the laser according to the invention.
Figure 4:
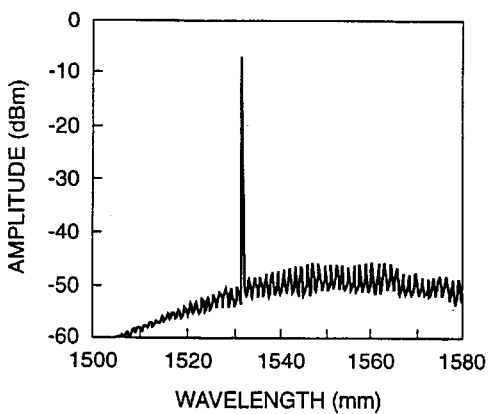
Figure 5:
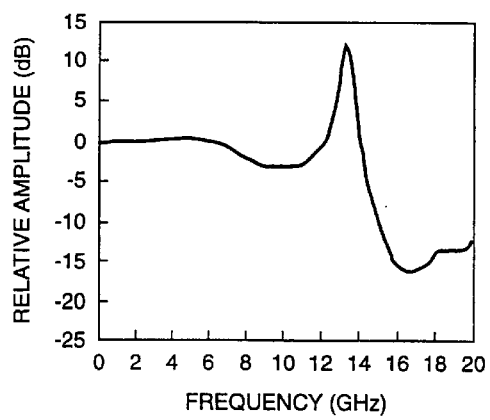

The graphs of FIGS. 3–5 allow evaluating the performance of a laser according to the invention. In particular, FIG. 3 is the power/current characteristic at the output of the fiber and shows that the invention provides a good linearity; FIG. 4, which is the amplitude/wavelength characteristic, shows the good single mode performance of the laser, lastly, FIG. 5 shows that the invention allows obtaining a very wide modulation band.

It is evident that the description above is provided purely by way of nonlimiting example and that variations and modifications are possible without thereby departing from the scope of the invention.

What is claimed is:

1. A hybrid laser, comprising a Fabry Perot cavity active element showing a facet treated with an anti-reflection coating, and an external cavity composed by a low reflectivity grating formed in a length of an optical fiber having an end adjacent to said facet, said grating forming a nonuniform and asymmetrical profile of modulation of reactive index in the direction of the length and generating a position of an equivalent mirror plane that is offset toward an end of the grating which is close to the active element.

2. A hybrid laser, comprising a Fabry Perot cavity active element showing a facet treated with an anti-reflection coating, and an external cavity composed by a low reflectivity grating formed in a length of an optical fiber having an end adjacent to said facet, said grating forming a nonuniform and asymmetrical profile of modulation of reactive index in the direction of the length and generating a position of an equivalent mirror plane that is offset toward an end of the grating which is close to the active element, said profile of modulation being represented by a curve which has minimum and substantially zero value, with a substantially horizontal tangent, in correspondence with another end of the grating which is further from the active element, and which gradually and monotonically rises to a maximum value with a substantially horizontal tangent, which is reached in correspondence with the other end of the grating where it returns to the minimum value with substantially vertical slope.

3. The laser according to claim 2 wherein said curve is chosen from among the following curves: $y=\exp(-x^2)$, $y=\sin^2 x$, $y=\tanh x$.

4. A hybrid laser, comprising a Fabry Perot cavity active element showing a facet treated with an anti-reflection coating, and an external cavity composed by a low reflectivity grating formed in a length of an optical fiber having an end adjacent to said facet, said grating forming a nonuniform and asymmetrical profile of modulation of reactive index in the direction of the length and generating a position of an equivalent mirror plane that is offset toward an end of the grating which is close to the active element, said length of said fiber being fastened onto a support at ends of the grating whereby a fiber portion including the grating is slightly curved between said ends.

* * * * *